United States Patent [19]
Ohashi

[11] Patent Number: 5,646,571
[45] Date of Patent: Jul. 8, 1997

[54] OUTPUT BUFFER CIRCUITS

[75] Inventor: Masayuki Ohashi, Tokyo, Japan

[73] Assignee: NEC Corporation, Tokyo, Japan

[21] Appl. No.: 533,830

[22] Filed: Sep. 26, 1995

[30] Foreign Application Priority Data

Sep. 26, 1994 [JP] Japan .................................. 6-229308

[51] Int. Cl.$^6$ .................................................. H03K 17/16
[52] U.S. Cl. ............................................ 327/390; 327/112
[58] Field of Search ...................................... 327/390, 112

[56] References Cited

U.S. PATENT DOCUMENTS

| | | | |
|---|---|---|---|
| 4,542,310 | 9/1985 | Ellis et al. | 327/112 |
| 4,992,681 | 2/1991 | Urakawa et al. | 307/475 |
| 5,241,502 | 8/1993 | Lee et al. | 327/390 |
| 5,319,604 | 6/1994 | Imondi et al. | 327/390 |
| 5,365,118 | 11/1994 | Wilcox | 327/390 |
| 5,546,029 | 8/1996 | Koke | 327/112 |

FOREIGN PATENT DOCUMENTS

| | | | |
|---|---|---|---|
| 0559996 | 9/1993 | European Pat. Off. | |
| 57-192119 | 11/1982 | Japan . | |
| 000636805 | 12/1978 | U.S.S.R. | 327/112 |

OTHER PUBLICATIONS

F. Goodenough, "ICs Yield High–Side FET–Drive Supply 11 V Above Power Rail", Electronic Design, Oct. 10, 1991, vol. 39, No. 19, p. 138.

K. Furutani et al., "An Adjustable Output Driver with Self–Recovering Vpp Generator For 4MX16 DRAM", IEEE, 1993, pp. 25.3.1–25.3.4.

*Primary Examiner*—Margaret Rose Wambach
*Attorney, Agent, or Firm*—Young & Thompson

[57] ABSTRACT

An output buffer circuit comprises a pair of first and second output MOS transistors coupled between a power supply line and a ground line; a booster circuit for boosting the power supply voltage up to a predetermined high voltage higher than a power supply voltage; a complementary MOS circuit comprising a pair of n-channel and p-channel MOS transistors connected in series between an output side of the booster circuit and the ground line; and a level shifter circuit having a first terminal coupled to an output side of a first logic gate for receiving logic signals from the first logic gate, a second terminal coupled to the gates of the n-channel and p-channel MOS transistors of the complementary MOS circuit and a third terminal coupled to the output side of the booster circuit for receiving the predetermined high voltage from the booster circuit, the level shifter circuit performing to shift the logic signal of the logic gate up to at least almost the same level as the predetermined high voltage to supply a shifted up signal to the gates of the n-channel and p-channel MOS transistors of the complementary MOS circuit.

17 Claims, 6 Drawing Sheets

OUTPUT BUFFER CIRCUITS

BACKGROUND OF THE INVENTION

1. Field of the Invention

The present invention provides an output buffer circuit in a semiconductor integrated circuit.

2. Description of the Related Art

In recent years, there has appeared a reduction to 3.3 V of a low power voltage used for driving semiconductor memory devices with a capacity in the range from 4 Mbits to 16 Mbits. Such reduction of the power voltage level renders it difficult to obtain the necessary output voltage of 2.4 V. In the prior art, in order to obtain the necessary output voltage, there is carried out a boost up of a voltage level of the gate of the MOS transistor which performs a switching operation for supplying a high level voltage to the output terminal of the output buffer circuit so that the high level corresponds to the power supply voltage. Conventional boost up circuits for boosting up the output voltage have utilized a capacitor or capacitors which are charged for the boost up only when the logic gate outputs a logic signal as an instruction of the output of the high voltage level from the output terminal of the output buffer circuit. Since the capacitor for the boost up operation begins to charge just before the logic signal is shifted between the high and low levels, there is a considerable necessary time for the charge up of the capacitor for obtaining the boost up of the output voltage which appears on the output terminal, thereby rendering it difficult to allow the output buffer circuit to show a high speed output performance for outputting a sufficiently high output voltage.

A conventional circuit configuration of the output buffer circuit will hereinafter be described with reference to FIG. 1. The conventional output buffer circuit is provided between logic gates and an output terminal 414 and biased by a power supply line which supplies a power supply voltage Vcc and a ground line which supplies a ground voltage. An output stage of the logic circuit comprises first and second NAND gates 401 and 402. An output stage of the output buffer circuit has first and second output n-channel MOS transistors 412 and 415, wherein the first output n-channel MOS transistor 412 is provided in series between the power supply line and the output terminal 414 of the output buffer circuit. The second output n-channel MOS transistor 415 is provided between the ground line and the output terminal 414 of the output buffer circuit. The first output n-channel MOS transistor 412 shows a switching operation associated with digital signals supplied by the first NAND gate 401. The second output n-channel MOS transistor 415 shows a switching operation associated with digital signals supplied by the second NAND gate 402. The first NAND gate 401 has two input terminals, one of which is provided for receipt of a digital signal "OUTH" and another is for receipt of an output enable signal "OE".

The second NAND gate 402 has two input terminals, one of which is provided for receipt of a digital signal "OUTL" and another is for receipt of an output enable signal "OE". The second NAND gate 402 has an output terminal coupled to an input terminal of an inverter 413 which has an output terminal coupled to a gate of the second output n-channel MOS transistor 415. The second output n-channel MOS transistor 415 has a drain coupled to the output terminal 414 of the output buffer circuit and a source coupled to the ground line. Logic signals from the output terminal of the second NAND gate 402 are inverted by the inverter 413 and then inputted into the gate of the second output n-channel MOS transistor 415.

The first NAND gate 401 has an output terminal coupled to gates of p-channel and n-channel MOS transistors 403 and 404 and further coupled to an input terminal of an inverter 405. The p-channel and n-channel MOS transistors 403 and 404 are provided to form the complementary MOS circuit. The p-channel MOS transistor 403 is coupled to the ground line and the n-channel MOS transistor is coupled to the power supply line. An output terminal of the complementary MOS circuit is coupled via an n-channel MOS transistor 407 to the gate of the first output n-channel MOS transistor 412. The output terminal of the first NAND gate 401 is coupled via an inverter 405 to a delay circuit 406. A NAND gate 409 has two input terminals, one of which is coupled to an output terminal of the delay circuit 406 and another input terminal is coupled to the input side of the delay circuit 406. An output terminal of the NAND gate 409 is coupled via an n-channel MOS transistor 408 to a gate of the n-channel MOS transistor 407. A gate of the n-channel MOS transistor 408 is coupled to the power supply line. The output terminal of the NAND gate 409 is coupled to an input terminal of the inverter 410 which has an output terminal coupled via a capacitor 411 to the gate of the first output n-channel MOS transistor 412.

When the NAND gate 401 outputs a high level signal, the p-channel MOS transistor 403 turns OFF and the n-channel MOS transistor 404 turns ON thereby the ground voltage is supplied via the n-channel MOS transistor 404 to the n-channel MOS transistor 407. The low level signal is also supplied to the inverter 405 and inverted by the inverter 405 into the high level signal. The high level signal is supplied to the delay circuit 406 which supplies the high level signal with a time delay. The high level signal with the time delay is then supplied to the input terminal of the NAND gate 409. The high level signal without any time delay is also supplied with the NAND gate 409. For an initial time duration, the NAND gate 409 outputs the high level signal and subsequently outputs the low level signal. For the initial time duration, the high level signal is inputted into the inverter 410 and then inverted into the low level signal which is further applied onto the capacitor 411. However, for the subsequent time duration, the NAND gate 409 outputs the low level signal which is supplied via the n-channel MOS transistor 408 into the gate of the n-channel MOS transistor 407 thereby the n-channel MOS transistor 407 turns OFF. On the other hand, the low level signal is supplied to the inverter 410 and then inverted into the high level signal which is further applied with the capacitor 411. As a result, the capacitor 411 is charged up where the n-channel MOS transistor is in the OFF state. The gate of the first output n-channel MOS transistor 412 is charged up with a considerable time delay and then turns ON thereby the power supply voltage appears with the considerable time delay. This means that the output buffer circuit which utilizes a capacitor for boosting up the high voltage level is engaged with the issue of a response time delay.

Another conventional output buffer circuit is disclosed and illustrated in FIG. 2. This conventional output buffer circuit is provided between the logic gates, for example, first and second NAND gates 501 and 502 and an output terminal 516. First and second output n-channel MOS transistors 515 and 517 are provided between a power supply line and a ground line. The first n-channel MOS transistor 515 is coupled between the power supply line Vcc and the output terminal 516. The second n-channel MOS transistor 517 is coupled between the ground line and the output terminal 516. The gate of the second output n-channel MOS transistor 517 is coupled via an inverter 514 to the second NAND gate 502. The gate of the first output n-channel MOS transistor 515 is coupled via a complementary MOS circuit to the first NAND gate 501 wherein the complementary MOS circuit comprises p-channel and n-channel MOS transistors 512 and 513. The n-channel MOS transistor 513 is coupled to the ground line and the p-channel MOS transistor 512 is coupled via an n-channel MOS transistor 508 to the power supply line. The n-channel MOS transistor 512 is also coupled via a capacitor 511 to an output side of a complementary MOS circuit comprising p-channel and n-channel MOS transistors 509 and 510. An input terminal of the complementary MOS circuit is coupled to the output terminal of the first NAND gate 501 and coupled via a capacitor 505 and n-channel MOS transistors 503 and 504 to the power supply line Vcc. The n-channel MOS transistors have diode connections wherein gates thereof are coupled to drain sides thereof respectively. The drain of the n-channel MOS transistor 504 is coupled to a gate of the n-channel MOS transistor 508. An n-channel MOS transistor 507 is coupled between the power supply line and the gate of the n-channel MOS transistor 508. A gate of the n-channel MOS transistor 507 is coupled to the drain of the n-channel MOS transistor 508. An n-channel MOS transistor 506 is coupled between the power supply line and the gate of the n-channel MOS transistor 508. A gate of the n-channel MOS transistor 506 is coupled to the power supply line Vcc.

The above two conventional output buffer circuits have the following disadvantages. The boosting up operation of the gate of the output MOS transistor is commenced after the charge up operation of the gate thereof up to the power supply voltage. The boosting up operation is thus completed with a large time delay. If the timing of the commencement of the boosting up operation is set earlier than the necessary time, this results in an insufficient voltage level boosted up thereby the output n-channel MOS transistor provides a certain voltage drop from the power supply voltage. Therefore, the above two conventional output buffer circuits are unable to satisfy both the requirements for the high speed response and the sufficiently high driving voltage level applied to the gate of the output MOS transistor coupled between the power supply line and the output terminal of the output buffer circuit. For that reason, it had been required to develop a quite novel output buffer circuits which is capable of satisfying the above both requirements for the high speed response and the sufficiently high driving voltage level applied to the gate of the output MOS transistor coupled between the power supply line and the output terminal of the output buffer circuit.

SUMMARY OF THE INVENTION

Accordingly, an object of the present invention to provide a novel output buffer circuit free from any problems as described above.

It is a further object of the present invention to provide a novel output buffer circuit free of any capacitor to be used for a pumping operation in accordance with the logic signals of the logic gates coupled to an input side of the novel output buffer circuit.

It is a furthermore object of the present invention to provide a novel output buffer circuit which shows an extremely high speed operation.

It is a still further object of the present invention to provide a novel output buffer circuit which has a relatively simple circuit configuration.

It is yet a further object of the present invention to provide a novel output buffer circuit which permits for a reduction in size of a mask to be used for forming the novel output buffer circuit.

It is a further more object of the present invention to provide a novel output buffer circuit which shows a considerably reduced power consumption.

It is a moreover object of the present invention to provide a novel output buffer circuit free from an insufficient charge at a gate of the switching transistor caused by a skew due to noises.

The above objects, features and advantages of the present invention will be apparent from the following descriptions.

The present invention provides a novel driver circuit coupled between an output side of a logic gate and a gate of a first output MOS transistor being paired with a second output MOS transistor for driving the gate of the first output MOS transistor according to logic signals from the logic gate. The first and second output MOS transistors are in the form of an output buffer circuit. The first output MOS transistor is provided between a power supply line supplied with a power supply voltage and an output terminal of the output buffer circuit. The second output MOS transistor is provided between the output terminal and a ground line supplied with a ground potential. The second output MOS transistor is driven according to other logic signals from an another logic gate.

The above driver circuit comprises a first element which is a booster circuit for boosting the power supply voltage up to a predetermined high voltage higher than the power supply voltage wherein the booster circuit keeps an output at the predetermined high voltage independently from the logic signals from the logic gate; a second element which is a complementary MOS circuit comprising a pair of n-channel and p-channel MOS transistors, both of which are connected in series between an output side of the booster circuit and a ground line, wherein the complementary MOS circuit has an output terminal coupled to the gate of the first output MOS transistor; a third element which is a level shifter circuit having a first terminal coupled to the output side of the logic gate for receiving the logic signal from the logic gate, a second terminal coupled to the gates of the n-channel and p-channel MOS transistors of the complementary MOS circuit and a third terminal coupled to the output side of the booster circuit for receiving the predetermined high voltage from the booster circuit. The level shifter circuit shifts the logic signal of the logic gate up to at least almost the same level as the predetermined high voltage to supply a shifted up signal to the gates of the n-channel and p-channel MOS transistors of the complementary MOS circuit.

The present invention also provides an output buffer circuit comprising a first element being a pair of first and second output MOS transistors, wherein the first output MOS transistor has a source coupled to a power supply line supplied with a power supply voltage, a drain coupled to an output terminal and a gate and the second output MOS transistor has a source coupled to a ground line supplied with a ground voltage, a drain coupled to the output terminal and a gate, a second element being a booster circuit for boosting the power supply voltage up to a predetermined high voltage higher than the power supply voltage, wherein the booster circuit keeps an output at the predetermined high voltage, a third element being a complementary MOS circuit comprising a pair of n-channel and p-channel MOS transistors, both of which are connected in series between an output side of the booster circuit and the ground line, wherein the complementary MOS circuit has an output terminal coupled to the gate of the first output MOS transistor, a fourth element being a level shifter circuit having a first terminal coupled to an output side of a first logic gate for receiving logic signals from the first logic gate, a second terminal coupled to the gates of the n-channel and p-channel MOS transistors of the complementary MOS circuit and a third terminal coupled to the output side of the booster circuit for receiving the predetermined high voltage from the booster circuit. The level shifter circuit shifts the logic signal of the logic gate up to at least almost the same level as the predetermined high voltage to supply a shifted up signal to the gates of the n-channel and p-channel MOS transistors of the complementary MOS circuit. An inverter logic circuit has an output terminal coupled to the gate of the second output MOS transistor and an input terminal coupled to a second logic gate.

The present invention also provides a driver circuit coupled between an output side of a logic gate and a gate of a first output MOS transistor being paired with a second output MOS transistor for driving the gate of the first output MOS transistor according to logic signals from the logic gate. The first and second output MOS transistors are in the form of an output buffer circuit. The first output MOS transistor is provided between a power supply line supplied with a power supply voltage and an output terminal of the output buffer circuit. The second output MOS transistor is provided between the output terminal and a ground line supplied with a ground potential. The second output MOS transistor is driven according to other logic signals from an another logic gate. The driver circuit comprises a first element being a booster circuit for boosting the power supply voltage up to a predetermined high voltage higher than the power supply voltage, wherein the booster circuit keeps an output at the predetermined high voltage independently from the logic signals from the logic gate, a second element being a switching circuit coupled between the output side of the booster circuit and a ground line supplied with a ground potential, wherein the switching circuit has an input terminal for receiving a switch control signal, according to which the switching circuit performs a switching operation to supply either the predetermined high voltage or the ground voltage to the gate of the first output MOS transistor, and a third element being a level shifter circuit having a first terminal coupled to the output side of the logic gate for receiving the logic signal from the logic gate, a second terminal coupled to the input terminal of the switching circuit and a third terminal coupled to the output side of the booster circuit for receiving the predetermined high voltage from the booster circuit. The level shifter circuit shifts the logic signal of the logic gate up to at least almost the same level as the predetermined high voltage to supply a shifted up signal to the input terminal of the switching circuit.

BRIEF DESCRIPTIONS OF THE DRAWINGS

Preferred embodiments of the present invention will be described in detail with reference to the accompanying drawings.

DESCRIPTIONS OF THE INVENTION

Figure 1:
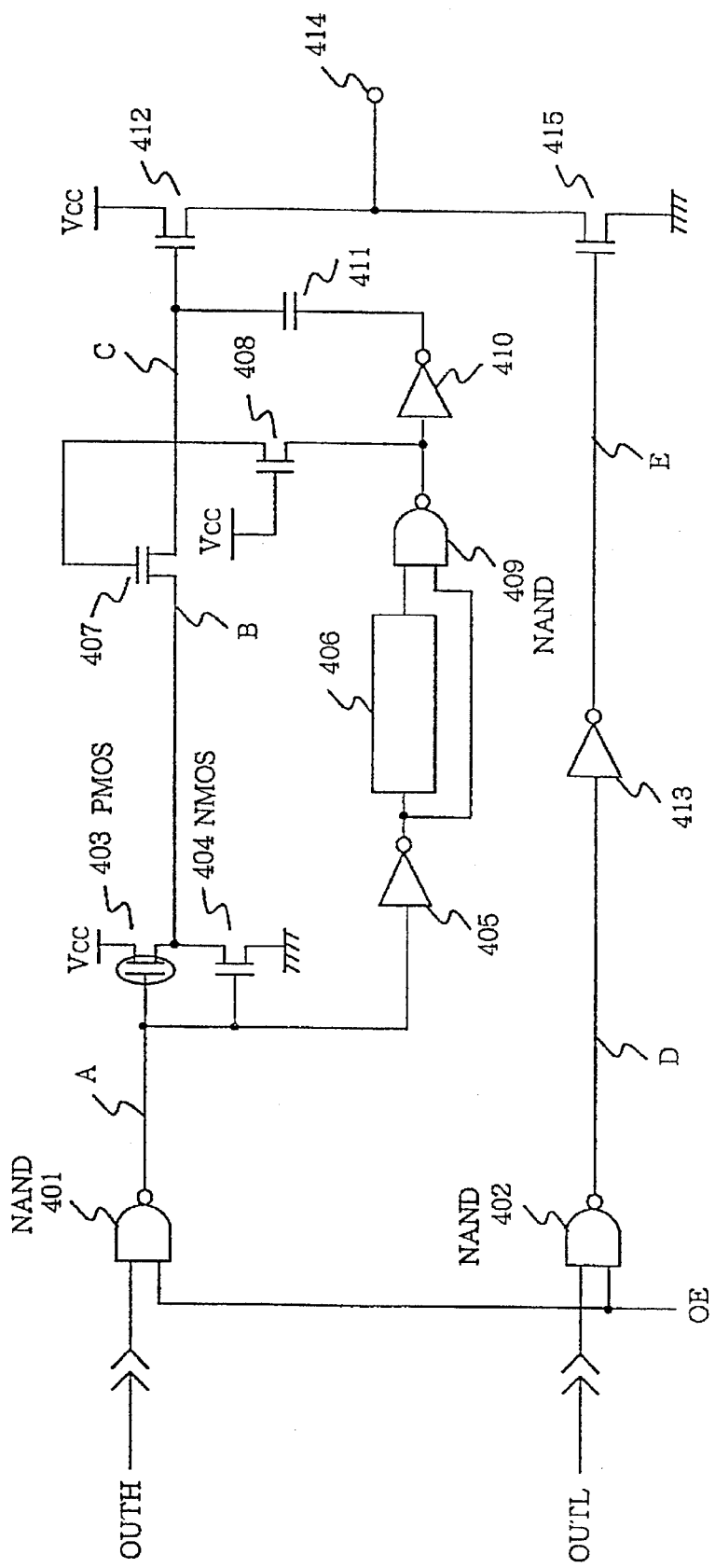
FIG. 1 is a circuit diagram illustrative of a conventional output buffer circuit.
Figure 2:
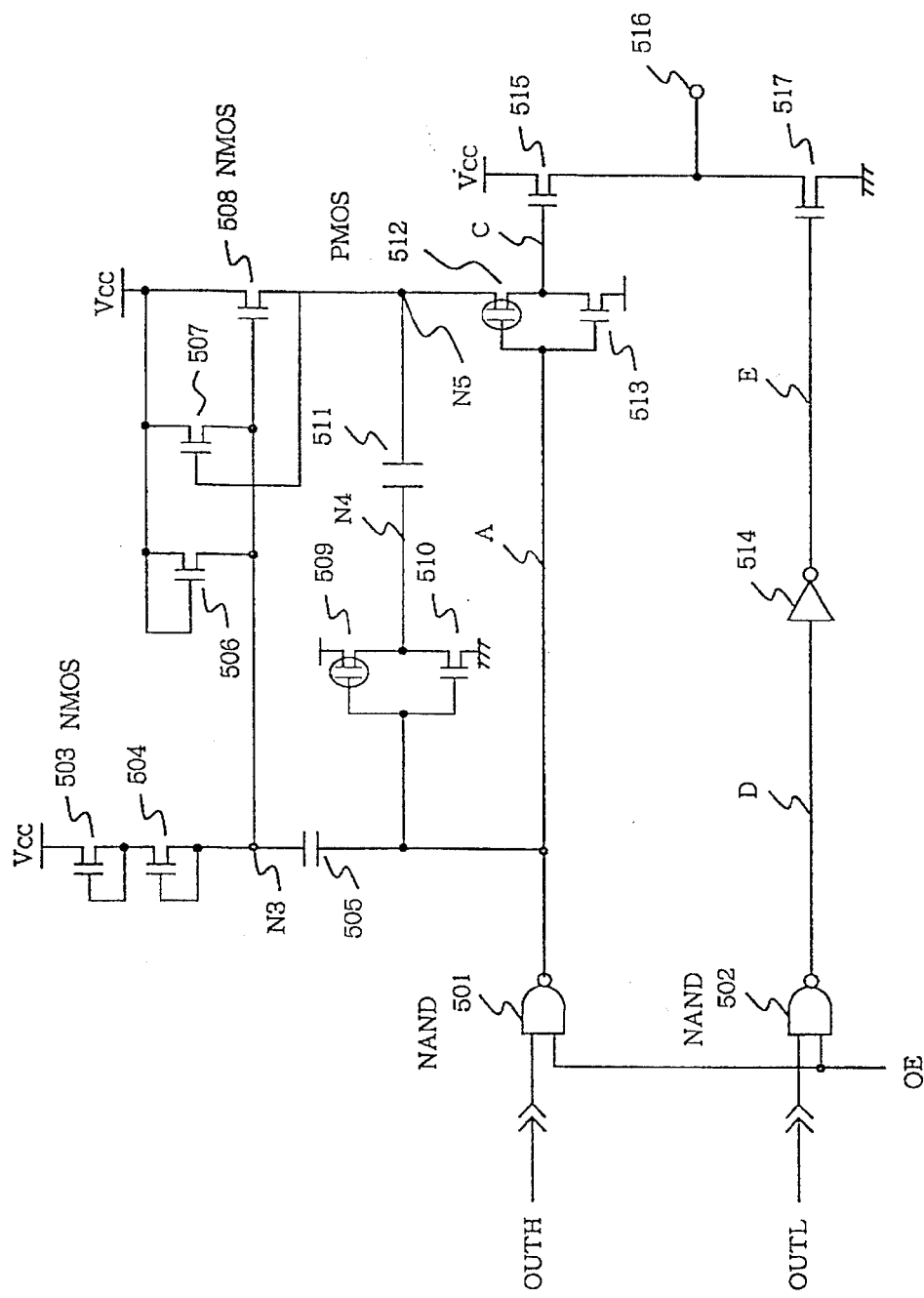
FIG. 2 is a circuit diagram illustrative of another conventional output buffer circuit.

The present invention provides a novel driver circuit coupled between an output side of a logic gate and a gate of a first output MOS transistor being paired with a second output MOS transistor for driving the gate of the first output MOS transistor according to logic signals from the logic gate. The first and second output MOS transistors are in the form of an output buffer circuit. The first output MOS transistor is provided between a power supply line supplied with a power supply voltage and an output terminal of the output buffer circuit. The second output MOS transistor is provided between the output terminal and a ground line supplied with a ground potential. The second output MOS transistor is driven according to other logic signals from another logic gate. The above driver circuit comprises the following elements.

A first element is a booster circuit for boosting the power supply voltage up to a predetermined high voltage higher than the power supply voltage wherein the booster circuit keeps an output at the predetermined high voltage independently from the logic signals from the logic gate.

A second element is a complementary MOS circuit comprising a pair of n-channel and p-channel MOS transistors, both of which are connected in series between an output side of the booster circuit and a ground line. The complementary MOS circuit has an output terminal coupled to the gate of the first output MOS transistor.

A third element is a level shifter circuit having a first terminal coupled to the output side of the logic gate for receiving the logic signal from the logic gate. The level shifter circuit has a second terminal coupled to the gates of the n-channel and p-channel MOS transistors of the complementary MOS circuit. The level shifter circuit also has a third terminal coupled to the output side of the booster circuit for receiving the predetermined high voltage from the booster circuit. The level shifter circuit shifts the logic signal of the logic gate up to at least almost the same level as the predetermined high voltage to supply a shifted up signal to the gates of the n-channel and p-channel MOS transistors of the complementary MOS circuit.

It is preferable that the p-channel MOS transistor has a source coupled to the output side of the booster circuit and a drain coupled to the output terminal coupled to the gate of the first output MOS transistor and the n-channel MOS transistor has a source coupled to the ground line and a drain coupled to the output terminal coupled to the gate of the first output MOS transistor.

In practice, the level shifter circuit may comprise the following elements. A first p-channel MOS transistor has a gate coupled to the second terminal of the level shifter circuit, a drain and a source coupled to the third terminal of the level shifter circuit. A second p-channel MOS transistor has a gate coupled to the drain of the first p-channel MOS transistor, a drain coupled to the second terminal of the level shifter circuit and a source coupled to the third terminal of the level shifter circuit. A first n-channel MOS transistor has a gate coupled to the first terminal of the level shifter circuit, a drain coupled to the gate of the second p-channel MOS transistor and a source coupled to a ground line and a drain coupled to the drain of the first p-channel MOS transistor. A second n-channel MOS transistor has a gate, a drain coupled to the second terminal of the level shifter circuit and a source coupled to a ground line. An invertor logic circuit having an input terminal coupled to the third terminal of the level shifter circuit and an output terminal coupled to the gate of the second n-channel MOS transistor.

Alternatively, the level shifter circuit may comprise the following elements. A first p-channel MOS transistor has a gate coupled to the second terminal of the level shifter circuit, a drain and a source coupled to the third terminal of the level shifter circuit. A second p-channel MOS transistor has a gate coupled to the drain of the first p-channel MOS transistor, a drain coupled to the second terminal of the level shifter circuit and a source coupled to the third terminal of the level shifter circuit. A first n-channel MOS transistor has a gate coupled to the first terminal of the level shifter circuit, a drain coupled to the gate of the second p-channel MOS transistor and a source coupled to a ground line and a drain coupled to the drain of the first p-channel MOS transistor. A second n-channel MOS transistor has a gate coupled to the power supply line, a drain coupled to the first terminal of the level shifter circuit and a source coupled to the second terminal of the level shifter circuit.

The first output MOS transistor may comprise an n-channel MOS transistor having a source coupled to the power supply line, a source coupled to the output terminal and a gate coupled to the second terminal of the level shifter circuit. The second output MOS transistor may comprise an n-channel MOS transistor having a source coupled to the ground line, a source coupled to the output terminal and a gate coupled to the second terminal of the level shifter circuit.

The present invention also proves an output buffer circuit comprising the following elements. A first element is a pair of first and second output MOS transistors, wherein the first output MOS transistor has a source coupled to a power supply line supplied with a power supply voltage, a drain coupled to an output terminal and a gate and the second output MOS transistor having a source coupled to a ground line supplied with a ground voltage, a drain coupled to the output terminal and a gate. A second element is a booster circuit for boosting the power supply voltage up to a predetermined high voltage higher than the power supply voltage. The booster circuit keeps an output at the predetermined high voltage. A third element is a complementary MOS circuit comprising a pair of n-channel and p-channel MOS transistors, both of which are connected in series between an output side of the booster circuit and the ground line. The complementary MOS circuit has an output terminal coupled to the gate of the first output MOS transistor. A fourth element is a level shifter circuit having a first terminal coupled to an output side of a first logic gate for receiving logic signals from the first logic gate. The level shifter circuit has a second terminal coupled to the gates of the n-channel and p-channel MOS transistors of the complementary MOS circuit. The level shifter circuit also has a third terminal coupled to the output side of the booster circuit for receiving the predetermined high voltage from the booster circuit. The level shifter circuit shifts the logic signal of the logic gate up to at least almost the same level as the predetermined high voltage to supply a shifted up signal to the gates of the n-channel and p-channel MOS transistors of the complementary MOS circuit. An inverter logic circuit has an output terminal coupled to the gate of the second output MOS transistor and an input terminal coupled to a second logic gate.

It is preferable that the p-channel MOS transistor has a source coupled to the output side of the booster circuit and a drain coupled to the output terminal coupled to the gate of the first output MOS transistor and the n-channel MOS transistor has a source coupled to the ground line and a drain coupled to the output terminal coupled to the gate of the first output MOS transistor.

In practice, the level shifter circuit comprises the following elements. A first p-channel MOS transistor has a gate coupled to the second terminal of the level shifter circuit, a drain and a source coupled to the third terminal of the level shifter circuit. A second p-channel MOS transistor has a gate coupled to the drain of the first p-channel MOS transistor, a drain coupled to the second terminal of the level shifter circuit and a source coupled to the third terminal of the level shifter circuit. A first n-channel MOS transistor has a gate coupled to the first terminal of the level shifter circuit, a drain coupled to the gate of the second p-channel MOS transistor and a source coupled to a ground line and a drain coupled to the drain of the first p-channel MOS transistor. A second n-channel MOS transistor has a gate; a drain coupled to the second terminal of the level shifter circuit and a source coupled to a ground line. An invertor logic circuit has an input terminal coupled to the third terminal of the level shifter circuit and an output terminal coupled to the gate of the second n-channel MOS transistor.

Alternatively, the level shifter circuit comprises the following elements. A first p-channel MOS transistor has a gate coupled to the second terminal of the level shifter circuit, a drain and a source coupled to the third terminal of the level shifter circuit. A second p-channel MOS transistor has a gate coupled to the drain of the first p-channel MOS transistor, a drain coupled to the second terminal of the level shifter circuit and a source coupled to the third terminal of the level shifter circuit. A first n-channel MOS transistor has a gate coupled to the first terminal of the level shifter circuit, a drain coupled to the gate of the second p-channel MOS transistor and a source coupled to a ground line and a drain coupled to the drain of the first p-channel MOS transistor. A second n-channel MOS transistor has a gate coupled to the power supply line, a drain coupled to the first terminal of the level shifter circuit and a source coupled to the second terminal of the level shifter circuit.

It is preferable that the first and second output MOS transistors are an n-channel type.

The present invention also provides a driver circuit coupled between an output side of a logic gate and a gate of a first output MOS transistor being paired with a second output MOS transistor for driving the gate of the first output MOS transistor according to logic signals from the logic gate. The first and second output MOS transistors are in the form of an output buffer circuit. The first output MOS transistor is provided between a power supply line supplied with a power supply voltage and an output terminal of the output buffer circuit. The second output MOS transistor is provided between the output terminal and a ground line supplied with a ground potential. The second output MOS transistor is driven according to another logic signals from an another logic gate. The driver circuit comprises the following elements.

A first element is a booster circuit for boosting the power supply voltage up to a predetermined high voltage higher than the power supply voltage, the booster circuit keeping an output at the predetermined high voltage independently from the logic signals from the logic gate.

A second element is a switching circuit coupled between the output side of the booster circuit and a ground line supplied with a ground potential, the switching circuit having an input terminal for receiving a switch control signal, according to which the switching circuit performs a switching operation to supply either the predetermined high voltage or the ground voltage to the gate of the first output MOS transistor.

A third element is a level shifter circuit having a first terminal coupled to the output side of the logic gate for receiving the logic signal from the logic gate. The level shifter circuit has a second terminal coupled to the input terminal of the switching circuit. The level shifter circuit also has a third terminal coupled to the output side of the booster circuit for receiving the predetermined high voltage from the booster circuit. The level shifter circuit performs to shift the logic signal of the logic gate up to at least almost the same level as the predetermined high voltage to supply a shifted up signal to the input terminal of the switching circuit.

It is preferable that the switching circuit comprises a complementary MOS circuit comprising a pair of n-channel and p-channel MOS transistors, both of which are connected in series between an output side of the booster circuit and the ground line. The p-channel MOS transistor has a source coupled to the output side of the booster circuit and a drain coupled to the output terminal coupled to the gate of the first output MOS transistor. The n-channel MOS transistor has a source coupled to the ground line and a drain coupled to the output terminal coupled to the gate of the first output MOS transistor.

In practice, the level shifter circuit may comprise the following steps. A first p-channel MOS transistor has a gate coupled to the second terminal of the level shifter circuit, a drain and a source coupled to the third terminal of the level shifter circuit. A second p-channel MOS transistor has a gate coupled to the drain of the first p-channel MOS transistor, a drain coupled to the second terminal of the level shifter circuit and a source coupled to the third terminal of the level shifter circuit. A first n-channel MOS transistor has a gate coupled to the first terminal of the level shifter circuit, a drain coupled to the gate of the second p-channel MOS transistor and a source coupled to a ground line and a drain coupled to the drain of the first p-channel MOS transistor. A second n-channel MOS transistor has a gate, a drain coupled to the second terminal of the level shifter circuit and a source coupled to a ground line. An invertor logic circuit has an input terminal coupled to the third terminal of the level shifter circuit and an output terminal coupled to the gate of the second n-channel MOS transistor.

Alternatively, the level shifter circuit may comprise the following elements. A first p-channel MOS transistor has a gate coupled to the second terminal of the level shifter circuit, a drain and a source coupled to the third terminal of the level shifter circuit. A second p-channel MOS transistor has a gate coupled to the drain of the first p-channel MOS transistor, a drain coupled to the second terminal of the level shifter circuit and a source coupled to the third terminal of the level shifter circuit. A first n-channel MOS transistor has a gate coupled to the first terminal of the level shifter circuit, a drain coupled to the gate of the second p-channel MOS transistor and a source coupled to a ground line and a drain coupled to the drain of the first p-channel MOS transistor. A second n-channel MOS transistor has a gate coupled to the power supply line, a drain coupled to the first terminal of the level shifter circuit and a source coupled to the second terminal of the level shifter circuit.

It is preferable that the first output MOS transistor comprises an n-channel MOS transistor having a source coupled to the power supply line, a source coupled to the output terminal and a gate coupled to the second terminal of the level shifter circuit. The second output MOS transistor comprises an n-channel MOS transistor having a source coupled to the ground line, a source coupled to the output terminal and a gate coupled to the second terminal of the level shifter circuit.

The present invention provides the following advantages. The novel output buffer circuit is provided with the booster circuit which keeps to supply the boosted up high voltage independently from the logic signals from the logic gates for example the first and second NAND gates and further provided with the level shifter circuit which shifts the power supply voltage up to the high voltage which is higher than the power supply voltage, wherein the high voltage Vb is applied to the input side of the complementary MOS circuit thereby the p-channel MOS transistor whose drain is applied with the high voltage is permitted to show a high speed switching operation. The booster circuit keeps to output the high voltage which is applied onto the source of the p-channel MOS transistor of the complementary MOS circuit. If the p-channel MOS transistor of the complementary MOS circuit turns ON, the high voltage is supplied onto the gate of the first output n-channel MOS transistor to thereby allow the first output n-channel MOS transistor to transmit the power supply voltage of the source electrode thereof to the drain electrode thereof without any voltage drop, resulting in the power supply voltage appears on the output terminal of the output buffer circuit. The novel output buffer circuit is free of any capacitor to be used for a pumping operation in accordance with the logic signals of the logic gates coupled to an input side of the novel output buffer circuit. This may permit the novel output buffer circuit to show an extremely high speed operation. This may also permit the novel output buffer circuit to have a relatively simple circuit configuration. This may further permit for a reduction in size of a mask to be used for forming the novel output buffer circuit. This may further permit the novel output buffer circuit to show a considerably reduced power consumption. The novel output buffer circuit is free from an insufficient charge at a gate of the switching transistor caused by a skew due to noises.

PREFERRED EMBODIMENTS

Figure 3:
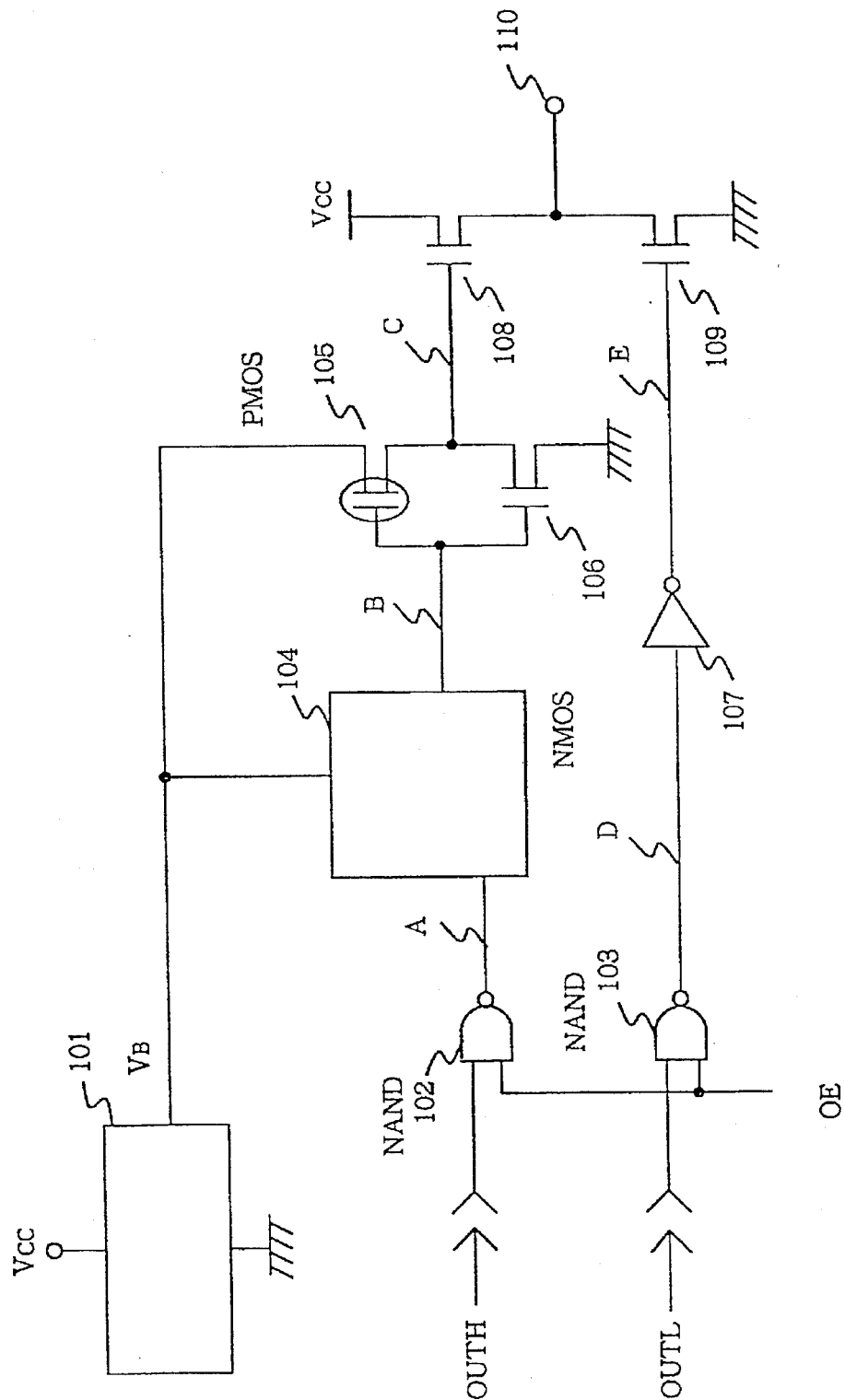
FIG. 3 is a circuit diagram illustrative of a novel output buffer circuit according to the present invention.

A first embodiment according to the present invention will be described with reference to FIG. 3 in which a novel output buffer circuit is provided. The output buffer circuit is provided between logic gates on a semiconductor integrated circuit and an output terminal for preventing any drop of a voltage level of output signals which appears on an output terminal 110. The output buffer circuit has an output stage on which first and second output n-channel MOS transistors 108 and 109 are provided to be coupled in series between a power supply line on which a power supply voltage Vcc is applied and a ground line having a ground voltage. The first output n-channel MOS transistor 108 has a source electrode coupled to the power supply line, a drain electrode coupled to the output terminal 110 and a gate electrode which receives logic signals comprising a ground voltage and a predetermined high voltage which is higher than the power supply voltage. The first output n-channel MOS transistor 109 has a source electrode coupled to the ground line, a drain electrode coupled to the drain electrode of the first output n-channel MOS transistor which is coupled to the output terminal 110 and a gate electrode which receives logic signals comprising a ground voltage level and a power supply voltage level. The gate of the first output n-channel MOS transistor 108 receives logic signals supplied via a driver circuit from an output of a first NAND gate 102 so that the first output n-channel MOS transistor 108 shows a switching operation according to the logic signals from the first NAND gate 102. The gate of the second output n-channel MOS transistor 109 receives logic signals supplied via an invertor 107 from an output of a second NAND gate 103 so that the second output n-channel MOS transistor 109 shows a switching operation according to the logic signals from the second NAND gate 103, wherein the invertor 107 has an output terminal coupled to the gate of the second output MOS transistor 109 and two input terminals, one of which receives logic signals "OUTL" and another receives an output enable signal "OE". The second NAND gate 103 outputs a high level corresponding to the power supply voltage of 3.3 V except when both the logic signal "OUTL" and the output enable signal "OE" are in the high level. The first NAND gate 102 has two input terminals, one of which receives logic signals "OUTH" and another receives an output enable signal "OE". The first NAND gate 102 outputs a high level corresponding to the power supply voltage of 3.3 V except when both the logic signal "OUTL" and the output enable signal "OE" are in the high level.

The novel output buffer circuit is provided with a booster circuit 101 which is provided between the power supply line applied with the power supply voltage of 3.3 V and the ground line supplied with the ground voltage of 0 V. The booster circuit 101 is so designed to keep an output voltage at a high voltage Vb of 4.9 V.

A level shifter circuit 104 is provided which has a first terminal coupled to an output of the first NAND gate 102 for receiving logic signals from the first NAND gate 102, a second terminal coupled to an output of the booster circuit 101 for receiving the high voltage Vb from the booster circuit 101 and a third terminal acting as an output terminal from which an output signal shifted up in voltage level outputs. The level shifter is designed to shift the voltage level of 3.3 V of the high level logic signal supplied from the NAND gate 102 up to the high voltage level of 4.9 V as the same level as the voltage level of 4.9 V that the third terminal of the level shifter circuit 104 receives so that the level shifter 104 outputs the digital signals comprising the low level of the ground voltage and the high level of the shifted up high voltage 4.9 V.

A complementary MOS circuit is provided which comprises a pair of n-channel and p-channel MOS transistors 105 and 106. The p-channel MOS transistor 105 of the complementary MOS circuit has a gate coupled to the third terminal of the level shifter circuit 104 for receiving the digital signals comprising the low level of the ground voltage and the high level of the shifted up high voltage 4.9 V, a source coupled to the output terminal of the booster circuit 101 for receiving the constant high voltage Vb which is 4.9 V and a drain coupled to the gate of the first output n-channel MOS transistor 108. The n-channel MOS transistor 106 of the complementary MOS circuit has a gate coupled to the third terminal of the level shifter circuit 104 for receiving the digital signals comprising the low level of the ground voltage and the high level of the shifted up high voltage 4.9 V, a source coupled to the ground line for receiving the ground voltage 0 V and a drain coupled to the gate of the first output n-channel MOS transistor 108. The p-channel MOS transistor 105 of the complementary MOS circuit receives the high level gate control signal as high as the voltage applied to the drain of the p-channel MOS transistor 105 thereby the p-channel MOS transistor 105 may show a high speed switching operation and may be free from any voltage loss between the source and drain. As a result, the high voltage level Vb which is applied on the source of the p-channel MOS transistor 105 may be transmitted to the drain without any voltage loss so that when the p-channel MOS transistor 105 turns ON, the high voltage Vb generated by the booster circuit 101 is transmitted via the p-channel MOS transistor 105 into the gate of the first output n-channel MOS transistor 108.

Figure 4:
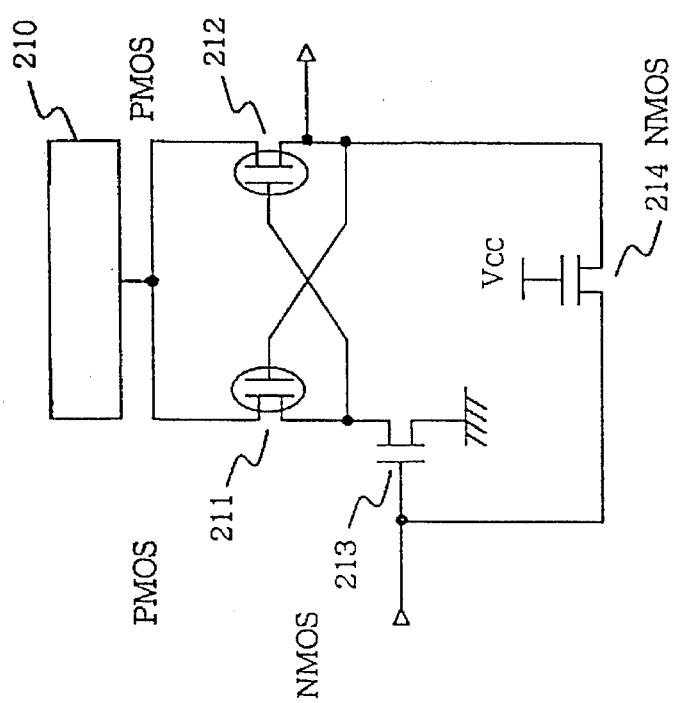
FIG. 4 is a circuit diagram illustrative of a level shifter circuit provided in a novel output buffer circuit according to the present invention.

The level shifter circuit may has a circuit configuration illustrated in FIG. 4. The level shifter circuit 104 comprises first and second p-channel MOS transistors 201 and 202, first and second n-channel MOS transistors 203 and 204 and an inverter 205. The first p-channel MOS transistor 201 has a source coupled to the third terminal which is coupled to the output terminal of the booster circuit 101 so that the source of the first p-channel MOS transistor 201 is kept in receipt of the constant high voltage Vb or 4.9 V. The first p-channel MOS transistor 201 has a drain coupled to a gate of the second p-channel MOS transistor 202. The first p-channel MOS transistor 201 has a gate coupled to a drain of the second p-channel MOS transistor 202 and also coupled to the second terminal as an output terminal. The second p-channel MOS transistor 202 has a source coupled to the third terminal which is coupled to the output terminal of the booster circuit 101 so that the source of the second p-channel MOS transistor 202 is kept in receipt of the constant high voltage Vb or 4.9 V. The first n-channel MOS transistor 203 has a gate coupled to the first terminal which receives the logic signals supplied from the first NAND gate. The first n-channel MOS transistor 203 has a source coupled to the ground line for receiving the ground voltage. The first n-channel MOS transistor 203 has a drain coupled to the drain of the first p-channel MOS transistor 201 and also coupled to the gate of the second p-channel MOS transistor 202. The second n-channel MOS transistor 204 has a gate coupled to an output of the inverter 205 for receiving the output signals from the inverter 205. The inverter 205 has an input terminal coupled to the first terminal of the level shifter circuit and also coupled to the gate of the first n-channel MOS transistor 203. The second n-channel MOS transistor 204 has a source coupled to the ground line for receiving the ground voltage. The second n-channel MOS transistor 204 has a drain coupled to the drain of the second p-channel MOS transistor 202 and also coupled to the gate of the first p-channel MOS transistor 201 as well as coupled to the output terminal of the level shifter circuit.

Figure 6:
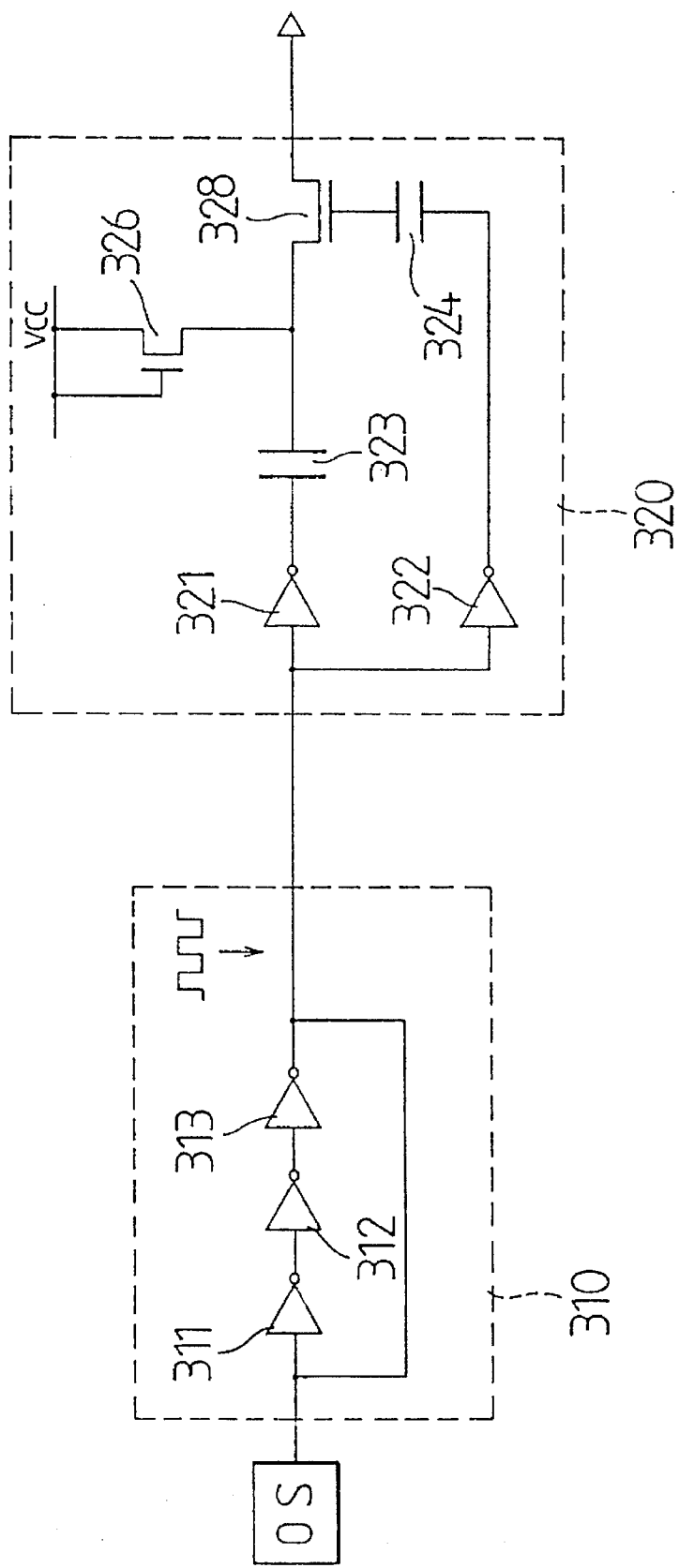
FIG. 6 is a circuit diagram illustrative of a booster circuit provided in a novel output buffer circuit according to the present invention.

The booster circuit 101 may be configured as illustrated in FIG. 6. The booster circuit 101 may comprise a pumping section 310 and a booster section 320. The pumping section 310 receives an oscillation signal from an oscillator and then generates a binary digit signal. The pumping section 310 may comprise a series of first to third inverters 311, 312 and 313 where an input side of the first inverter 311 is coupled to an output side of the third inverter 313. The booster section 320 performs to boost the high level Vcc of the binary digit signal up to the high voltage Vb. The booster section 320 comprises first and second inverters 321 and 322 whose input sides are coupled to the output side of the pumping section 310. The first inverter 321 has an output terminal coupled to a first side of a first capacitor 323. A first n-channel MOS transistor 326 is provided with a diode connection between the power supply line which has a power supply voltage Vcc and a second side of the first capacitor 323. In detail, the first n-channel MOS transistor 326 has a gate coupled to the power supply line, a source also coupled to the power supply line and a drain coupled to the second side of the capacitor 323. The second inverter 322 has an output terminal coupled to a first side of a second capacitor 324 which has a second side coupled to a gate of a second n-channel MOS transistor 325. A source of the second n-channel MOS transistor 325 is coupled to the second side of the capacitor 323 and also coupled to the drain of the first n-channel MOS transistor 326. A drain of the second n-channel MOS transistor 325 is coupled to an output terminal of the booster circuit. The output terminal of the booster circuit is kept to have the high voltage Vb.

The following descriptions will focus on the operations of the output buffer circuit of the first embodiment according to the present invention with reference to FIGS. 3, 4, 6 and 7. As can been seen from FIG. 3, the first output n-channel MOS transistor 108 is driven by the digital signals from the first NAND gate 102 and the second output n-channel MOS transistor 109 is driven by the digital signals from the second NAND gate 103. The NAND gate 103 outputs the low level signal only when both the signal "OUTL" and the output enable signal "OE" are in the high level. When the second NAND gate 103 outputs the low level signal, the inverter 107 inverts the low level signal to output the high level signal which is supplied onto the gate of the second output n-channel MOS transistor 109 thereby the second output n-channel MOS transistor 109 turns ON, resulting in the ground voltage is supplied onto the output terminal 110 of the output buffer circuit. When the second NAND gate 103 outputs the high level signal, the inverter 107 inverts the high level signal to output the low level signal which is supplied onto the gate of the second output n-channel MOS transistor 109 thereby the second output n-channel MOS transistor 109 turns OFF, resulting in the output terminal 110 of the output buffer circuit being disconnected from the ground line.

When the first NAND gate 102 outputs the high level signal, the gate of the first n-channel MOS transistor 203 receives the high level signal thereby the first n-channel MOS transistor 203 turns ON, resulting in the drain of the n-channel MOS transistor 203 has the ground potential or the low level voltage. This means that the drain of the first p-channel MOS transistor 201 and the gate of the second p-channel MOS transistor 202 also have the ground voltage or the low level voltage thereby the second p-channel MOS transistor 202 turns ON so that the drain of the second p-channel MOS transistor 202 is electrically conducted to the source thereof which is applied with the high voltage Vb generated by the booster circuit 101. As a result, the high voltage generated by the booster circuit 210 is then supplied via the second p-channel MOS transistor 212 to the second terminal of the level shifter circuit 104 and accordingly the high voltage Vb is then supplied onto the gates of the p-channel and n-channel MOS transistors 105 and 106. The p-channel MOS transistor 105 turns OFF to disconnect the drain thereof from the source which is coupled to the output of the booster circuit 101. The n-channel MOS transistor 106 turns ON thereby the drain is electrically conducted to the source which is coupled to the ground line, resulting in that the gate of the first output n-channel MOS transistor 108 turns OFF. The output terminal 110 of the output buffer circuit is isolated from the power supply line.

When the first NAND gate 102 outputs the low level signal, the gate of the first n-channel MOS transistor 203 receives the low level signal thereby the first n-channel MOS transistor 203 turns OFF, resulting in the drain of the n-channel MOS transistor 203 is separated from the ground line. The low level signal is also supplied onto the input terminal of the inverter 205 where the inverter 205 inverts the low level signal into the high level signal and then outputs the high level signal which is transmitted to the gate of the second n-channel MOS transistor 204. As a result, the n-channel MOS transistor 204 turns ON thereby the ground potential is supplied via the n-channel MOS transistor 204 to the second terminal of the level shifter 104. This means that the second terminal of the level shifter 104 has the low level voltage. Simultaneously, the low level signal is supplied onto the gate of the p-channel MOS transistor 201 thereby the p-channel MOS transistor 201 turns ON. As a result, the high voltage Vb applied onto the source of the first p-channel MOS transistor 201 is transmitted via the first p-channel MOS transistor 201 into the drain of the n-channel MOS transistor 203 and to the gate of the p-channel MOS transistor 202 thereby the p-channel MOS transistor 202 turns OFF. As a result, the second terminal of the level shifter 104 is electrically separated from the third terminal applied with the high voltage Vb. As described above, the second terminal of the level shifter 104 is electrically conducted to the ground line and then has the ground voltage. This means that the level shifter circuit 104 outputs the low level signal of the ground voltage which is then applied onto the gates of the p-channel and n-channel MOS transistors 105 and 106 of the complementary MOS circuit. As a result, the n-channel MOS transistor 106 turns OFF and the p-channel MOS transistor turns ON thereby the high voltage Vb generated by the booster circuit 101 is transmitted via the p-channel MOS transistor 105 to the gate of the first output n-channel MOS transistor 108. As a result, the first output n-channel MOS transistor 108 turns ON thereby the power voltage Vcc is transmitted via the first output n-channel MOS transistor 108 into the output terminal 110 of the output buffer circuit.

Figure 7:
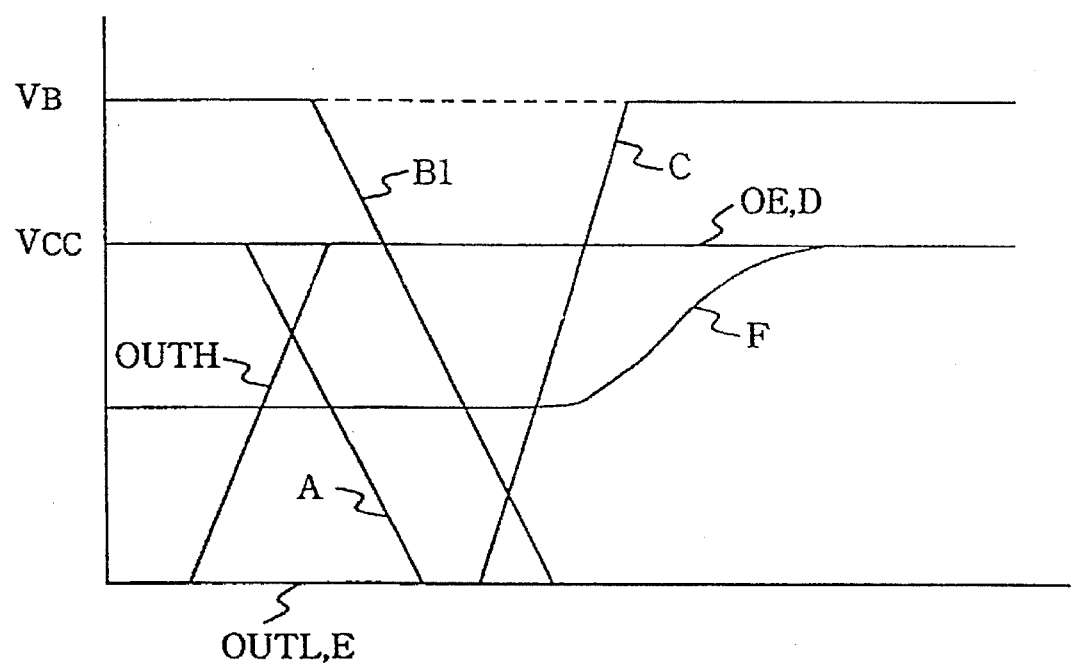
FIG. 7 is a view illustrative of waveforms of voltage levels of individual points of a novel output buffer circuit according to the present invention.

FIG. 7 illustrates variations of voltage levels of each position of the output buffer circuit. "A" represents a voltage level of the output of the first NAND gate 102 and the first terminal of the level shifter circuit 104. "B1" represents a voltage level of the output side of the level shifter circuit 104 and the input side of the complementary MOS circuit. "C" represents a voltage level of the output side of the complementary MOS circuit and the gate of the first output n-channel MOS transistor 108. "D" represents a voltage level of the output side of the second NAND gate and the input side of the invertor 107. "E" represents a voltage level of the output side of the inverter 107 and the gate of the second output n-channel MOS transistor 109. When the logic signal "OUTH" is raised from the ground voltage up to the power supply voltage Vcc and the logic signal "OUTL" is kept at the ground voltage, provided that the output enable signal OE is kept at the power supply voltage Vcc, a voltage of the output of the first NAND gate 102 is dropped from the power supply level down to the ground level as illustrated in a line "A". As a result, the voltage level of the output of the level shifter circuit 104 is dropped from the high voltage Vb down to the ground voltage thereby the voltage level "B" of the gates of the p-channel and n-channel MOS transistors is dropped from the high voltage Vb down to the ground voltage. As a result, the n-channel MOS transistor 106 turns OFF and the p-channel MOS transistor turns ON thereby the voltage level "C" of the first output n-channel MOS transistor 108 is raised from the ground voltage up to the high voltage Vb thereby the voltage of the output terminal 110 of the output buffer circuit is raised up to the power voltage Vcc from an intermediate voltage between the ground level and the power supply level Vcc. The output terminal 110 is electrically floated by the first and second output n-channel MOS transistors 108 and 109 until the first and second output n-channel MOS transistor 108 turns OFF. A term necessary for allowing the voltage of the output terminal 110 to rise from the intermediate voltage level up to the power supply voltage Vcc depends upon a load capacitance which is not illustrated and coupled to the output terminal 110 of the output buffer circuit. When the load capacitance is large, the rising up slope of the voltage of the output terminal 110 is gentle. By contrast, when the load capacitance is large, the rising up slope of the voltage of the output terminal 110 is steep. It was confirmed that the access time is about 1 nanosecond.

The present invention provides the following advantages. The novel output buffer circuit is provided with the booster circuit 101 which keeps to supply the boosted up high voltage independently from the logic signals from the logic gates for example the first and second NAND gates 102 and 103 and further provided with the level shifter circuit 104 which shifts the power supply voltage up to the high voltage Vb which is higher than the power supply voltage Vcc, wherein the high voltage Vb is applied to the input side of the complementary MOS circuit thereby the p-channel MOS transistor 105 whose drain is applied with the high voltage Vb is permitted to show a high speed switching operation. The booster circuit 101 keeps to output the high voltage which is applied onto the source of the p-channel MOS transistor 105 of the complementary MOS circuit. If the p-channel MOS transistor 105 of the complementary MOS circuit turns ON, the high voltage Vb is supplied onto the gate of the first output n-channel MOS transistor 108 to thereby allow the first n-channel MOS transistor to transmit the power supply voltage of the source electrode thereof to the drain electrode thereof without any voltage drop, resulting in the power supply voltage appears on the output terminal 110 of the output buffer circuit.

Figure 5:
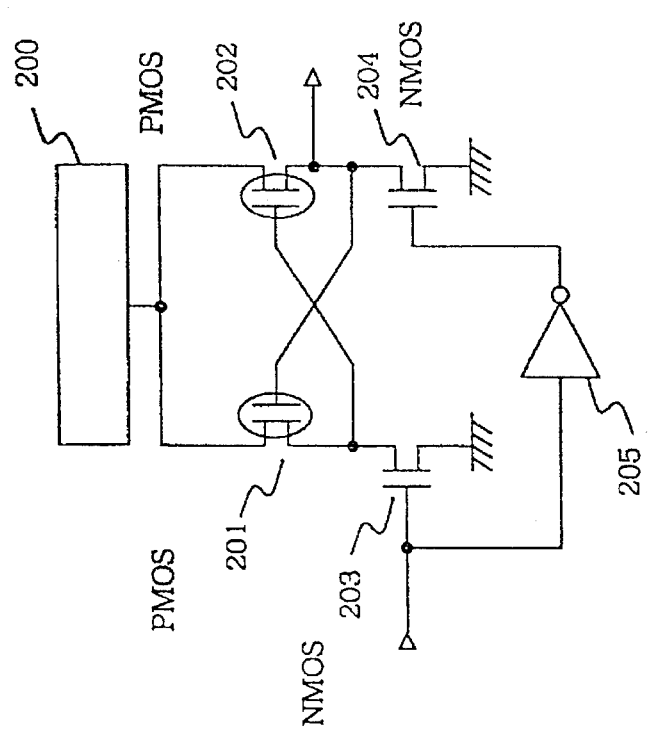
FIG. 5 is a circuit diagram illustrative of another level shifter circuit provided in a novel output buffer circuit according to the present invention.

A second embodiment according to the present invention will be described in which a novel output buffer circuit is provided which has a structural difference in a circuit configuration of a level shifter. Accordingly, the circuit configuration of the novel output buffer circuit is illustrated in FIGS. 3, 5 and 6.

The output buffer circuit is provided between logic gates on a semiconductor integrated circuit and an output terminal for preventing any drop of a voltage level of output signals which appear on an output terminal 110. The output buffer circuit has an output stage on which first and second output n-channel MOS transistors 108 and 109 are provided to be coupled in series between a power supply line on which a power supply voltage Vcc is applied and a ground line having a ground voltage. The first output n-channel MOS transistor 108 has a source electrode coupled to the power supply line, a drain electrode coupled to the output terminal 110 and a gate electrode which receives logic signals comprising a ground voltage and a predetermined high voltage which is higher than the power supply voltage. The first output n-channel MOS transistor 109 has a source electrode coupled to the ground line, a drain electrode coupled to the drain electrode of the first output n-channel MOS transistor which is coupled to the output terminal 110 and a gate electrode which receives logic signals comprising a ground voltage level and a power supply voltage level. The gate of the first output n-channel MOS transistor 108 receives logic signals supplied via a driver circuit from an output of a first NAND gate 102 so that the first output n-channel MOS transistor 108 shows a switching operation according to the logic signals from the first NAND gate 102. The gate of the second output n-channel MOS transistor 109 receives logic signals supplied via an inverter 107 from an output of a second NAND gate 103 so that the second output n-channel MOS transistor 109 shows a switching operation according to the logic signals from the second NAND gate 103, wherein the inverter 107 has an output terminal coupled to the gate of the second output MOS transistor 109 and two input terminals, one of which receives logic signals "OUTL" and another receives an output enable signal "OE". The second NAND gate 103 outputs a high level corresponding to the power supply voltage of 3.3 V except when both the logic signal "OUTL" and the output enable signal "OE" are in the high level. The first NAND gate 102 has two input terminals, one of which receives logic signals "OUTH" and another receives an output enable signal "OE". The first NAND gate 102 outputs a high level corresponding to the power supply voltage of 3.3 V except when both the logic signal "OUTL" and the output enable signal "OE" are in the high level.

The novel output buffer circuit is provided with a booster circuit 101 which is provided between the power supply line applied with the power supply voltage of 3.3 V and the ground line supplied with the ground voltage of 0 V. The booster circuit 101 is so designed to keep an output voltage at a high voltage Vb of 4.9 V.

A level shifter circuit 104 is provided which has a first terminal coupled to an output of the first NAND gate 102 for receiving logic signals from the first NAND gate 102, a second terminal coupled to an output of the booster circuit 101 for receiving the high voltage Vb from the booster circuit 101 and a third terminal acting as an output terminal from which an output signal shifted up in voltage level outputs. The level shifter is designed to shift the voltage level of 3.3 V of the high level logic signal supplied from the NAND gate 102 up to the high voltage level of 4.9 V as the same level as the voltage level of 4.9 V that the third terminal of the level shifter circuit 104 receives so that the level shifter 104 outputs the digital signals comprising the low level of the ground voltage and the high level of the shifted up high voltage 4.9 V.

A complementary MOS circuit is provided which comprises a pair of n-channel and p-channel MOS transistors 105 and 106. The p-channel MOS transistor 105 of the complementary MOS circuit has a gate coupled to the third terminal of the level shifter circuit 104 for receiving the digital signals comprising the low level of the ground voltage and the high level of the shifted up high voltage 4.9 V, a source coupled to the output terminal of the booster circuit 101 for receiving the constant high voltage Vb which is 4.9 V and a drain coupled to the gate of the first output n-channel MOS transistor 108. The n-channel MOS transistor 106 of the complementary MOS circuit has a gate coupled to the third terminal of the level shifter circuit 104 for receiving the digital signals comprising the low level of the ground voltage and the high level of the shifted up high voltage 4.9 V, a source coupled to the ground line for receiving the ground voltage 0 V and a drain coupled to the gate of the first output n-channel MOS transistor 108. The p-channel MOS transistor 105 of the complementary MOS circuit receives the high level gate control signal as high as the voltage applied to the drain of the p-channel MOS transistor 105 thereby the p-channel MOS transistor 105 may show a high speed switching operation and may be free from any voltage loss between the source and drain. As a result, the high voltage level Vb which is applied on the source of the p-channel MOS transistor 105 may be transmitted to the drain without any voltage loss so that when the p-channel MOS transistor 105 turns ON, the high voltage Vb generated by the booster circuit 101 is transmitted via the p-channel MOS transistor 105 into the gate of the first output n-channel MOS transistor 108.

The level shifter circuit may has a circuit configuration illustrated in FIG. 5. The level shifter circuit 104 comprises first and second p-channel MOS transistors 211 and 212 and first and second n-channel MOS transistors 213 and 214. The first p-channel MOS transistor 211 has a source coupled to the third terminal which is further coupled to the output terminal of the booster circuit 101. The first p-channel MOS transistor 211 also has a gate coupled to the second terminal which is coupled to the input side of the complementary MOS circuit. The first p-channel MOS transistor 211 also has a drain coupled to a drain of the first n-channel MOS transistor 213. The first n-channel MOS transistor 213 has a gate coupled to the first terminal of the level shifter wherein the first terminal is coupled to the first NAND gate 102. The first n-channel MOS transistor 213 has the ground line. The second n-channel MOS transistor 214 has a gate coupled to the power supply line Vcc. The second n-channel MOS transistor 214 has a source coupled to the gate of the first n-channel MOS transistor 213 and also coupled to the first terminal of the level shifter circuit. The second n-channel MOS transistor 214 has a drain coupled to the second terminal of the level shifter circuit wherein the second terminal is coupled to the input side of the complementary MOS circuit. The second p-channel MOS transistor 212 has a source coupled to the third terminal of the level shifter wherein the third terminal is coupled to the output terminal of the booster circuit 101. The second p-channel MOS transistor 212 also has a gate coupled to the drain of the first p-channel MOS transistor 211. The second p-channel MOS transistor 212 also has a drain coupled to the second terminal of the level shifter wherein the second terminal is coupled to the input side of the complementary MOS circuit.

The booster circuit 101 may be configured as illustrated in FIG. 6. The booster circuit 101 may comprise a pumping section 310 and a booster section 320. The pumping section 310 receives an oscillation signal from an oscillator and then generates a binary digit signal. The pumping section 310 may comprise a series of first to third inverters 311, 312 and 313 where an input side of the first inverter 311 is coupled to an output side of the third inverter 313. The booster section 320 performs to boost the high level Vcc of the binary digit signal up to the high voltage Vb. The booster section 320 comprises first and second inverters 321 and 322 whose input sides are coupled to the output side of the pumping section 310. The first inverter 321 has an output terminal coupled to a first side of a first capacitor 323. A first n-channel MOS transistor 326 is provided with a diode connection between the power supply line which has a power supply voltage Vcc and a second side of the first capacitor 323. In detail, the first n-channel MOS transistor 326 has a gate coupled to the power supply line, a source also coupled to the power supply line and a drain coupled to the second side of the capacitor 323. The second inverter 322 has an output terminal coupled to a first side of a second capacitor 324 which has a second side coupled to a gate of a second n-channel MOS transistor 325. A source of the second n-channel MOS transistor 325 is coupled to the second side of the capacitor 323 and also coupled to the drain of the first n-channel MOS transistor 326. A drain of the second n-channel MOS transistor 325 is coupled to an output terminal of the booster circuit. The output terminal of the booster circuit is kept to have the high voltage Vb.

The following descriptions will focus on the operations of the output buffer circuit of the first embodiment according to the present invention with reference to FIGS. 3, 5, 6 and 7. As can been seen from FIG. 3, the first output n-channel MOS transistor 108 is driven by the digital signals from the first NAND gate 102 and the second output n-channel MOS transistor 109 is driven by the digital signals from the second NAND gate 103. The NAND gate 103 outputs the low level signal only when both the signal "OUTL" and the output enable signal "OE" are in the high level. When the second NAND gate 103 outputs the low level signal, the inverter 107 inverts the low level signal to output the high level signal which is supplied onto the gate of the second output n-channel MOS transistor 109 thereby the second output n-channel MOS transistor 109 turns ON, resulting in the ground voltage is supplied onto the output terminal 110 of the output buffer circuit. When the second NAND gate 103 outputs the high level signal, the inverter 107 inverts the high level signal to output the low level signal which is supplied onto the gate of the second output n-channel MOS transistor 109 thereby the second output n-channel MOS transistor 109 turns OFF, resulting in the output terminal 110 of the output buffer circuit being disconnected from the ground line.

When the first NAND gate 102 outputs the high level signal, the gate of the first n-channel MOS transistor 213 receives the high level signal thereby the first n-channel MOS transistor 213 turns ON, resulting in the drain of the n-channel MOS transistor 213 has the ground potential or the low level voltage. This means that the drain of the first p-channel MOS transistor 211 and the gate of the second p-channel MOS transistor 212 also have the ground voltage or the low level voltage thereby the second p-channel MOS transistor 212 turns ON so that the drain of the second p-channel MOS transistor 212 is electrically conducted to the source thereof which is applied with the high voltage Vb generated by the booster circuit 101. As a result, the high voltage generated by the booster circuit 210 is then supplied via the second p-channel MOS transistor 212 to the second terminal of the level shifter circuit 104 and accordingly the high voltage Vb is then supplied onto the gates of the p-channel and n-channel MOS transistors 105 and 106. The p-channel MOS transistor 105 turns OFF to disconnect the drain thereof from the source which is coupled to the output of the booster circuit 101. The n-channel MOS transistor 106 turns ON thereby the drain is electrically conducted to the source which is coupled to the ground line, resulting in that the gate of the first output n-channel MOS transistor 108 turns OFF. The output terminal 110 of the output buffer circuit is isolated from the power supply line.

When the first NAND gate 102 outputs the low level signal, the gate of the first n-channel MOS transistor 213 receives the low level signal thereby the first n-channel MOS transistor 213 turns OFF, resulting in the drain of the n-channel MOS transistor 213 is separated from the ground line. The low level signal is also supplied via the second n-channel MOS transistor 214 which is kept in ON state onto the second terminal of the level shifter 104. This means that the second terminal of the level shifter 104 has the low level voltage. Simultaneously, the low level signal is supplied onto the gate of the p-channel MOS transistor 211 thereby the p-channel MOS transistor 211 turns ON. As a result, the high voltage Vb applied onto the source of the first p-channel MOS transistor 211 is transmitted via the first p-channel MOS transistor 211 into the drain of the n-channel MOS transistor 213 and to the gate of the p-channel MOS transistor 212 thereby the p-channel MOS transistor 212 turns OFF. As a result, the second terminal of the level shifter 104 is electrically separated from the third terminal applied with the high voltage Vb. As described above, the second terminal of the level shifter 104 is electrically conducted to the ground line and then has the ground voltage. This means that the level shifter circuit 104 outputs the low level signal of the ground voltage which is then applied onto the gates of the p-channel and n-channel MOS transistors 105 and 106 of the complementary MOS circuit. As a result, the n-channel MOS transistor 106 turns OFF and the p-channel MOS transistor turns ON thereby the high voltage Vb generated by the booster circuit 101 is transmitted via the p-channel MOS transistor 105 to the gate of the first output n-channel MOS transistor 108. As a result, the first output n-channel MOS transistor 108 turns ON thereby the power voltage Vcc is transmitted via the first output n-channel MOS transistor 108 into the output terminal 110 of the output buffer circuit.

FIG. 7 illustrates variations of voltage levels of each position of the output buffer circuit. "A" represents a voltage level of the output of the first NAND gate 102 and the first terminal of the level shifter circuit 104. "B1" represents a voltage level of the output side of the level shifter circuit 104 and the input side of the complementary MOS circuit. "C" represents a voltage level of the output side of the complementary MOS circuit and the gate of the first output n-channel MOS transistor 108. "D" represents a voltage level of the output side of the second NAND gate and the input side of the inverter 107. "E" represents a voltage level of the output side of the invertor 107 and the gate of the second output n-channel MOS transistor 109. When the logic signal "OUTH" is raised from the ground voltage up to the power supply voltage Vcc and the logic signal "OUTL" is kept at the ground voltage, provided that the output enable signal OE is kept at the power supply voltage Vcc, a voltage of the output of the first NAND gate 102 is dropped from the power supply level down to the ground level as illustrated in a line "A". As a result, the voltage level of the output of the level shifter circuit 104 is dropped from the high voltage Vb down to the ground voltage thereby the voltage level "B" of the gates of the p-channel and n-channel MOS transistors is dropped from the high voltage Vb down to the ground voltage. As a result, the n-channel MOS transistor 106 turns OFF and the p-channel MOS transistor turns ON thereby the voltage level "C" of the first output n-channel MOS transistor 108 is raised from the ground voltage up to the high voltage Vb thereby the voltage of the output terminal 110 of the output buffer circuit is raised up to the power voltage Vcc from an intermediate voltage between the ground level and the power supply level Vcc. The output terminal 110 is electrically floated by the first and second output n-channel MOS transistors 108 and 109 until the first and second output n-channel MOS transistor 108 turns OFF. A term necessary for allowing the voltage of the output terminal 110 to rise from the intermediate voltage level up to the power supply voltage Vcc depends upon a load capacitance which is not illustrated and coupled to the output terminal 110 of the output buffer circuit. When the load capacitance is large, the rising up slope of the voltage of the output terminal 110 is gentle. By contrast, when the load capacitance is large, the rising up slope of the voltage of the output terminal 110 is steep. It was confirmed that the access time is about 1 nanosecond.

The present invention provides the following advantages. The novel output buffer circuit is provided with the booster circuit 101 which keeps to supply the boosted up high voltage independently from the logic signals from the logic gates for example the first and second NAND gates 102 and 103 and further provided with the level shifter circuit 104 which shifts the power supply voltage up to the high voltage Vb which is higher than the power supply voltage Vcc, wherein the high voltage Vb is applied to the input side of the complementary MOS circuit thereby the p-channel MOS transistor 105 whose drain is applied with the high voltage is permitted to show a high speed switching operation. The booster circuit 101 keeps to output the high voltage which is applied onto the source of the p-channel MOS transistor 105 of the complementary MOS circuit. If the p-channel MOS transistor 105 of the complementary MOS circuit turns ON, the high voltage Vb is supplied onto the gate of the first output n-channel MOS transistor 108 to thereby allow the first output n-channel MOS transistor 108 to transmit the power supply voltage of the source electrode thereof to the drain electrode thereof without any voltage drop, resulting in the power supply voltage appears on the output terminal 110 of the output buffer circuit.

Whereas modifications of the present invention will be apparent to a person having ordinary skill in the art, to which the invention pertains, it is to be understood that embodiments shown and described by way of illustrations are by no means intended to be considered in a limiting sense. Accordingly, it is to be intended to cover by claims all modifications which fall within the sprite and scope of the present invention.

What is claimed is:

1. A driver circuit coupled between an output side of a logic gate and a gate of a first output MOS transistor being paired with a second output MOS transistor for driving said gate of said first output MOS transistor according to logic signals from said logic gate, said first and second output MOS transistors forming an output buffer circuit, said first output MOS transistor being provided between a power supply line supplied with a power supply voltage and an output terminal of said output buffer circuit, said second output MOS transistor being provided between said output terminal and a ground line supplied with a ground potential, said second output MOS transistor being driven according to other logic signals from another logic gate, said driver circuit comprising:

a booster circuit for boosting said power supply voltage up to a predetermined high voltage higher than said power supply voltage, said booster circuit keeping an output at said predetermined high voltage independently from said logic signals from said logic gate;

a complementary MOS circuit comprising a pair of n-channel and p-channel MOS transistors, both of which are connected in series between an output side of said booster circuit and a ground line, said complementary MOS circuit having an output terminal coupled to said gate of said first output MOS transistor; and a level shifter circuit having a first terminal coupled to said output side of said logic gate for receiving said logic signal from said logic gate, said level shifter circuit having a second terminal coupled to said gates of said n-channel and p-channel MOS transistors of said complementary MOS circuit, said level shifter circuit also having a third terminal coupled to said output side of said booster circuit for receiving said predetermined high voltage from said booster circuit, said level shifter circuit shifting said logic signal of said logic gate up to at least almost the same level as said predetermined high voltage to supply a shifted up signal to said gates of said n-channel and p-channel MOS transistors of said complementary MOS circuit, said level shifter circuit comprising:

a first p-channel MOS transistor having a gate coupled to said second terminal of said level shifter circuit, a drain and a source coupled to said third terminal of said level shifter circuit;

a second p-channel MOS transistor having a gate coupled to said drain of said first p-channel MOS transistor, a drain coupled to said second terminal of said level shifter circuit and a source coupled to said third terminal of said level shifter circuit;

a first n-channel MOS transistor having a gate coupled to said first terminal of said level shifter circuit, a drain coupled to said gate of said second p-channel MOS transistor and a source coupled to a ground line and a drain coupled to said drain of said first p-channel MOS transistor;

a second n-channel MOS transistor having a gate, a drain coupled to said second terminal of said level shifter circuit and a source coupled to a ground line; and an inverter logic circuit having an input terminal coupled to said third terminal of said level shifter circuit and an output terminal coupled to said gate of said second n-channel MOS transistor.

2. The driver circuit as claimed in claim 1, wherein said p-channel MOS transistor has a source coupled to said output side of said booster circuit and a drain coupled to said output terminal coupled to said gate of said first output MOS transistor and said n-channel MOS transistor has a source coupled to said ground line and a drain coupled to said output terminal coupled to said gate of said first output MOS transistor.

3. A driver circuit coupled between an output side of a logic gate and a gate of a first output MOS transistor being paired with a second output MOS transistor for driving said gate of said first output MOS transistor according to logic signals from said logic gate, said first and second output MOS transistors forming an output buffer circuit, said first output MOS transistor being provided between a power supply line supplied with a power supply voltage and an output terminal of said output buffer circuit, said second output MOS transistor being provided between said output terminal and a ground line supplied with a ground potential, said second output MOS transistor being driven according to other logic signals from another logic gate, said driver circuit comprising:

a booster circuit for boosting said power supply voltage up to a predetermined high voltage higher than said power supply voltage, said booster circuit keeping an output at said predetermined high voltage independently from said logic signals from said logic gate;

a complementary MOS circuit comprising a pair of n-channel and p-channel MOS transistors, both of which are connected in series between an output side of said booster circuit and a ground line, said complementary MOS circuit having an output terminal coupled to said gate of said first output MOS transistor; and a level shifter circuit having a first terminal coupled to said output side of said logic gate for receiving said logic signal from said logic gate, said level shifter circuit having a second terminal coupled to said gates of said n-channel and p-channel MOS transistors of said complementary MOS circuit, said level shifter circuit also having a third terminal coupled to said output side of said booster circuit for receiving said predetermined high voltage from said booster circuit, said level shifter circuit shifting said logic signal of said logic gate up to at least almost the same level as said predetermined high voltage to supply a shifted up signal to said gates of said n-channel and p-channel MOS transistors of said complementary MOS circuit, said level shifter circuit comprising:

a first p-channel MOS transistor having a gate coupled to said second terminal of said level shifter circuit, a drain and a source coupled to said third terminal of said level shifter circuit;

a second p-channel MOS transistor having a gate coupled to said drain of said first p-channel MOS transistor, a drain coupled to said second terminal of said level shifter circuit and a source coupled to said third terminal of said level shifter circuit;

a first n-channel MOS transistor having a gate coupled to said first terminal of said level shifter circuit, a drain coupled to said gate of said second p-channel MOS transistor and a source coupled to a ground line and a drain coupled to said drain of said first p-channel MOS transistor;

a second n-channel MOS transistor having a gate coupled to said power supply line, a drain coupled to said first terminal of said level shifter circuit and a source coupled to said second terminal of said level shifter circuit.

4. The driver circuit as claimed in claim 3, wherein said p-channel MOS transistor has a source coupled to said output side of said booster circuit and a drain coupled to said output terminal coupled to said gate of said first output MOS transistor and n-channel MOS transistor has a source coupled to said ground line and a drain coupled to said output terminal coupled to said gate of said first output MOS transistor.

5. A driver circuit coupled between an output side of a logic gate and a gate of a first output MOS transistor being paired with a second output MOS transistor for driving said gate of said first output MOS transistor according to logic signals from said logic gate, said first and second output MOS transistors forming an output buffer circuit, said first output MOS transistor being provided between a power supply line supplied with a power supply voltage and an output terminal of said output buffer circuit, said second output MOS transistor being provided between said output terminal and a ground line supplied with a ground potential, said second output MOS transistor being driven according to other logic signals from another logic gate, said driver circuit comprising:

a booster circuit for boosting said power supply voltage up to a predetermined high voltage higher than said power supply voltage, said booster circuit keeping an output at said predetermined high voltage independently from said logic signals from said logic gate;

a complementary MOS circuit comprising a pair of n-channel and p-channel MOS transistors, both of which are connected in series between an output side of said booster circuit and a ground line, said complementary MOS circuit having an output terminal coupled to said gate of said first output MOS transistor; and a level shifter circuit having a first terminal coupled to said output side of said logic gate for receiving said logic signal from said logic gate, said level shifter circuit having a second terminal coupled to said gates of said n-channel and p-channel MOS transistors of said complementary MOS circuit, said level shifter circuit also having a third terminal coupled to said output side of said booster circuit for receiving said predetermined high voltage from said booster circuit, said level shifter circuit shifting said logic signal of said logic gate up to at least almost the same level as said predetermined high voltage to supply a shifted up signal to said gates of said n-channel and p-channel MOS transistors of said complementary MOS circuit, said first output MOS transistor being an n-channel MOS transistor having a source coupled to said power supply line, a drain coupled to said output terminal and a gate coupled to said second terminal of said level shifter circuit, and said second output MOS transistor being an n-channel MOS transistor having a source coupled to said ground line, a drain coupled to said output terminal and a gate coupled to said second terminal of said level shifter circuit.

6. The driver circuit as claimed in claim 5, wherein said p-channel MOS transistor has a source coupled to said output side of said booster circuit and a drain coupled to said output terminal coupled to said gate of said first output MOS transistor and n-channel MOS transistor has a source coupled to said ground line and a drain coupled to said output terminal coupled to said gate of said first output MOS transistor.

7. An output buffer circuit comprising:

a pair of first and second output MOS transistors, said first output MOS transistor having a source coupled to a power supply line supplied with a power supply voltage, a drain coupled to an output terminal and a gate and said second output MOS transistor having a source coupled to a ground line supplied with a ground voltage, a drain coupled to said output terminal and a gate;

a booster circuit for boosting said power supply voltage up to a predetermined high voltage higher than said power supply voltage, said booster circuit keeping an output at said predetermined high voltage;

a complementary MOS circuit comprising a pair of n-channel and p-channel MOS transistors, both of which are connected in series between an output side of said booster circuit and said ground line, said complementary MOS circuit having an output terminal coupled to said gate of said first output MOS transistor;

a level shifter circuit having a first terminal coupled to an output side of a first logic gate for receiving logic signals from said first logic gate, said level shifter circuit having a second terminal coupled to said gates of said n-channel and p-channel MOS transistors of said complementary MOS circuit, said level shifter circuit also having a third terminal coupled to said output side of said booster circuit for receiving said predetermined high voltage from said booster circuit, said level shifter circuit shifting said logic signal of said logic gate up to at least almost the same level as said predetermined high voltage to supply a shifted up signal to said gates of said n-channel and p-channel MOS transistors of said complementary MOS circuit, said level shifter circuit comprising:

a first p-channel MOS transistor having a gate coupled to said second terminal of said level shifter circuit, a drain and a source coupled to said third terminal of said level shifter circuit;

a second p-channel MOS transistor having a gate coupled to said drain of said first p-channel MOS transistor, a drain coupled to said second terminal of said level shifter circuit and a source coupled to said third terminal of said level shifter circuit;

a first n-channel MOS transistor having a gate coupled to said first terminal of said level shifter circuit, a drain coupled to said gate of said second p-channel MOS transistor and a source coupled to a ground line and a drain coupled to said drain of said first p-channel MOS transistor;

a second n-channel MOS transistor having a gate, a drain coupled to said second terminal of said level shifter circuit and a source coupled to a ground line;

an inverter logic circuit having an input terminal coupled to said third terminal of said level shifter circuit and an output terminal coupled to said gate of said second n-channel MOS transistor; and an inverter logic circuit having an output terminal coupled to said gate of said second output MOS transistor and an input terminal coupled to a second logic gate.

8. The output buffer circuit as claimed in claim 7, wherein said p-channel MOS transistor has a source coupled to said output side of said booster circuit and a drain coupled to said output terminal coupled to said gate of said first output MOS transistor and said n-channel MOS transistor has a source coupled to said ground line and a drain coupled to said output terminal coupled to said gate of said first output MOS transistor.

9. The output buffer circuit as claimed in claim 7, wherein said first and second output MOS transistors are an n-channel type.

10. An output buffer circuit comprising:

a pair of first and second output MOS transistors, said first output MOS transistor having a source coupled to a power supply line supplied with a power supply voltage, a drain coupled to an output terminal and a gate and said second output MOS transistor having a source coupled to a ground line supplied with a ground voltage, a drain coupled to said output terminal and a gate;

a booster circuit for boosting said power supply voltage up to a predetermined high voltage higher than said power supply voltage, said booster circuit keeping an output at said predetermined high voltage;

a complementary MOS circuit comprising a pair of n-channel and p-channel MOS transistors, both of which are connected in series between an output side of said booster circuit and said ground line, said complementary MOS circuit having an output terminal coupled to said gate of said first output MOS transistor;

a level shifter circuit having a first terminal coupled to an output side of a first logic gate for receiving logic signals from said first logic gate, said level shifter circuit having a second terminal coupled to said gates of said n-channel and p-channel MOS transistors of said complementary MOS circuit, said level shifter circuit also having a third terminal coupled to said output side of said booster circuit for receiving said predetermined high voltage from said booster circuit, said level shifter circuit shifting said logic signal of said logic gate up to at least almost the same level as said predetermined high voltage to supply a shifted up signal to said gates of said n-channel and p-channel MOS transistors of said complementary MOS circuit, said level shifter circuit comprising:

a first p-channel MOS transistor having a gate coupled to said second terminal of said level shifter circuit, a drain and a source coupled to said third terminal of said level shifter circuit;

a second p-channel MOS transistor having a gate coupled to said drain of said first p-channel MOS transistor, a drain coupled to said second terminal of said level shifter circuit and a source coupled to said third terminal of said level shifter circuit;

a first n-channel MOS transistor having a gate coupled to said first terminal of said level shifter circuit, a drain coupled to said gate of said second p-channel MOS transistor and a source coupled to a ground line and a drain coupled to said drain of said first p-channel MOS transistor;

a second n-channel MOS transistor having a gate coupled to said power supply line, a drain coupled to said first terminal of said level shifter circuit and a source coupled to said second terminal of said level shifter circuit; and an inverter logic circuit having an output terminal coupled to said gate of said second output MOS transistor and an input terminal coupled to a second logic gate.

11. The output buffer circuit as claimed in claim 10, wherein said p-channel MOS transistor has a source coupled to said output side of said booster circuit and a drain coupled to said output terminal coupled to said gate of said first output MOS transistor and said n-channel MOS transistor has a source coupled to said ground line and a drain coupled to said output terminal coupled to said gate of said first output MOS transistor.

12. The output buffer circuit as claimed in claim 10, wherein said first and second output MOS transistors are an n-channel type.

13. A driver circuit coupled between an output side of a logic gate and a gate of a first output MOS transistor being paired with a second output MOS transistor for driving said gate of said first output MOS transistor according to logic signals from said logic gate, said first and second output MOS transistors forming an output buffer circuit, said first output MOS transistor being provided between a power supply line supplied with a power supply voltage and an output terminal of said output buffer circuit, said second output MOS transistor being provided between said output terminal a ground line supplied with a ground potential, said second output MOS transistor being driven according to another logic signals from another logic gate, said driver circuit comprising:

a booster circuit for boosting said power supply voltage up to a predetermined high voltage higher than said power supply voltage, said booster circuit keeping an output at said predetermined high voltage independently from said logic signals from said logic gate;

a switching circuit coupled between said output side of said booster circuit and a ground line supplied with a ground potential, said switching circuit having an input terminal for receiving a switch control signal, according to which said switching circuit performs a switching operation to supply either said predetermined high voltage or said ground voltage to said gate of said first output MOS transistor, said switching circuit comprising a complementary MOS circuit comprising a pair of n-channel and p-channel MOS transistors, both of which are connected in series between an output side of said booster circuit and said ground line, said p-channel MOS transistor has a source coupled to said output side of said booster circuit and a drain connected to said output terminal coupled to said gate of said first MOS transistor, said n-channel MOS transistor having a source coupled to said ground line and a drain coupled to said output terminal coupled to said gate of said first output MOS transistor; and a level shifter circuit having a first terminal coupled to said output side of said logic gate for receiving said logic signal from said logic gate, said level shifter circuit having a second terminal coupled to said input terminal of said switching circuit, said level shifter circuit also having a third terminal coupled to said output side of said booster circuit for receiving said predetermined high voltage from said booster circuit, said level shifter circuit shifting said logic signal of said logic gate up to at least almost the same level as said predetermined high voltage to supply a shifted up signal to said input terminal of said switching circuit, said level shifter circuit comprising:

a first p-channel MOS transistor having a gate coupled to said second terminal of said level shifter circuit, a drain and a source coupled to said third terminal of said level shifter circuit;

a second p-channel MOS transistor having a gate coupled to said drain of said first p-channel MOS transistor, a drain coupled to said second terminal of said level shifter circuit and a source coupled to said third terminal of said level shifter circuit;

a first n-channel MOS transistor having a gate coupled to said first terminal of said level shifter circuit, a drain coupled to said gate of said second p-channel MOS transistor and a source coupled to a ground line and a drain coupled to said drain of said first p-channel MOS transistor;

a second n-channel MOS transistor having a gate, a drain coupled to said second terminal of said level shifter circuit and a source coupled to a ground line; and an inverter logic circuit having an input terminal coupled to said third terminal of said level shifter circuit and an output terminal coupled to said gate of said second n-channel MOS transistor.

14. The drive circuit as claimed in claim 13, wherein said first output MOS transistor is an n-channel MOS transistor having a source coupled to said power supply line, a drain coupled to said output terminal and a gate coupled to said second terminal of said level shifter circuit and said second output MOS transistor is an n-channel MOS transistor having a source coupled to said ground line, a drain coupled to said output terminal and a gate coupled to said second terminal of said level shifter circuit.

15. A driver circuit coupled between an output side of a logic gate and a gate of a first output MOS transistor being paired with a second output MOS transistor for driving said gate of said first output MOS transistor according to logic signals from said logic gate, said first and second output MOS transistors forming an output buffer circuit, said first output MOS transistor being provided between a power supply line supplied with a power supply voltage and an output terminal of said output buffer circuit, said second output MOS transistor being provided between said output terminal a ground line supplied with a ground potential, said second output MOS transistor being driven according to another logic signals from another logic gate, said driver circuit comprising:

a booster circuit for boosting said power supply voltage up to a predetermined high voltage higher than said power supply voltage, said booster circuit keeping an output at said predetermined high voltage independently from said logic signals from said logic gate;

a switching circuit coupled between said output side of said booster circuit and a ground line supplied with a ground potential, said switching circuit having an input terminal for receiving a switch control signal, according to which said switching circuit performs a switching operation to supply either said predetermined high voltage or said ground voltage to said gate of said first output MOS transistor, said switching circuit comprising a complementary MOS circuit comprising a pair of n-channel and p-channel MOS transistors, both of which are connected in series between an output side of said booster circuit and said ground line, said p-channel MOS transistor has a source coupled to said output side of said booster circuit and a drain connected to said output terminal coupled to said gate of said first MOS transistor, said n-channel MOS transistor having a source coupled to said ground line and a drain coupled to said output terminal coupled to said gate of said first output MOS transistor; and a level shifter circuit having a first terminal coupled to said output side of said logic gate for receiving said logic signal from said logic gate, said level shifter circuit having a second terminal coupled to said input terminal of said switching circuit, said level shifter circuit also having a third terminal coupled to said output side of said booster circuit for receiving said predetermined high voltage from said booster circuit, said level shifter circuit shifting said logic signal of said logic gate up to at least almost the same level as said predetermined high voltage to supply a shifted up signal to said input terminal of said switching circuit, said level shifter circuit comprises:

a first p-channel MOS transistor having a gate coupled to said second terminal of said level shifter circuit, a drain and a source coupled to said third terminal of said level shifter circuit;

a second p-channel MOS transistor having a gate coupled to said drain of said first p-channel MOS transistor, a drain coupled to said second terminal of said level shifter circuit and a source coupled to said third terminal of said level shifter circuit;

a first n-channel MOS transistor having a gate coupled to said first terminal of said level shifter circuit, a drain coupled to said gate of said second p-channel MOS transistor and a source coupled to a ground line and a drain coupled to said drain of said first p-channel MOS transistor;

a second n-channel MOS transistor having a gate coupled to said power supply line, a drain coupled to said first terminal of said level shifter circuit and a source coupled to said second terminal of said level shifter circuit.

16. The drive circuit as claimed in claim 15, wherein said first output MOS transistor is an n-channel MOS transistor having a source coupled to said power supply line, a chain coupled to said output terminal and a gate coupled to said second terminal of said level shifter circuit and said second output MOS transistor is an n-channel MOS transistor having a source coupled to said ground line, a drain coupled to said output terminal and a gate coupled to said second terminal of said level shifter circuit.

17. A driver circuit coupled between an output side of a logic gate and a gate of a first output MOS transistor being paired with a second output MOS transistor for driving said gate of said first output MOS transistor according to logic signals from said logic gate, said first and second output MOS transistors forming an output buffer circuit, said first output MOS transistor being provided between a power supply line supplied with a power supply voltage and an output terminal of said output buffer circuit, said second output MOS transistor being provided between said output terminal a ground line supplied with a ground potential, said second output MOS transistor being driven according to another logic signals from another logic gate, said driver circuit comprising:

a booster circuit for boosting said power supply voltage up to a predetermined high voltage higher than said power supply voltage, said booster circuit keeping an output at said predetermined high voltage independently from said logic signals from said logic gate;

a switching circuit coupled between said output side of said booster circuit and a ground line supplied with a ground potential, said switching circuit having an input terminal for receiving a switch control signal, according to which said switching circuit performs a switching operation to supply either said predetermined high voltage or said ground voltage to said gate of said first output MOS transistor; and a level shifter circuit having a first terminal coupled to said output side of said logic gate for receiving said logic signal from said logic gate, said level shifter circuit having a second terminal coupled to said input terminal of said switching circuit, said level shifter circuit also having a third terminal coupled to said output side of said booster circuit for receiving said predetermined high voltage from said booster circuit, said level shifter circuit shifting said logic signal of said logic gate up to at least almost the same level as said predetermined high voltage to supply a shifted up signal to said input terminal of said switching circuit, said first output MOS transistor is an n-channel MOS transistor having a source coupled to said power supply line, a chain coupled to said output terminal and a gate coupled to said second terminal of said level shifter circuit and said second output MOS transistor is an n-channel MOS transistor having a source coupled to said ground line, a drain coupled to said output terminal and a gate coupled to said second terminal of said level shifter circuit.

* * * * *